(12) United States Patent
Yoshida et al.

(10) Patent No.: US 7,283,346 B2
(45) Date of Patent: Oct. 16, 2007

(54) ELECTROSTATIC CHUCK AND ITS MANUFACTURING METHOD

(75) Inventors: Kazuto Yoshida, Hyogo (JP); Masahiko Inoue, Hyogo (JP); Ryuichi Matsuda, Hyogo (JP); Hitoshi Sakamoto, Kanagawa (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 309 days.

(21) Appl. No.: 10/481,425

(22) PCT Filed: Dec. 26, 2002

(86) PCT No.: PCT/JP02/13645

§ 371 (c)(1),
(2), (4) Date: Dec. 22, 2003

(87) PCT Pub. No.: WO2004/061941

PCT Pub. Date: Jul. 22, 2004

(65) Prior Publication Data

US 2004/0233609 A1 Nov. 25, 2004

(51) Int. Cl.
*H01T 2/30* (2006.01)
(52) U.S. Cl. ............................... 361/234; 361/230
(58) Field of Classification Search ......... 361/230–234
See application file for complete search history.

(56) References Cited

U.S. PATENT DOCUMENTS

| 5,001,594 | A | * | 3/1991 | Bobbio | 361/234 |
| 5,166,856 | A | * | 11/1992 | Liporace et al. | 361/233 |
| 5,522,131 | A | * | 6/1996 | Steger | 29/829 |
| 5,822,172 | A | * | 10/1998 | White | 361/234 |
| 5,993,678 | A | | 11/1999 | Ohkawa | |
| 6,566,632 | B1 | * | 5/2003 | Katata et al. | 219/444.1 |
| 6,730,276 | B2 | * | 5/2004 | Kosakai et al. | 422/186.05 |
| 6,946,625 | B2 | * | 9/2005 | Kuibira et al. | 219/444.1 |
| 6,992,876 | B1 | * | 1/2006 | Nakajima et al. | 361/234 |
| 2001/0019472 | A1 | | 9/2001 | Kanno et al. | |
| 2002/0006680 | A1 | | 1/2002 | Katala et al. | |

FOREIGN PATENT DOCUMENTS

| JP | 6-77309 | 3/1994 |
| JP | 8-55900 | 2/1996 |
| JP | 10-83894 | 3/1998 |
| WO | 01/04945 | 1/2001 |

* cited by examiner

*Primary Examiner*—Michael Sherry
*Assistant Examiner*—Danny Nguyen
(74) *Attorney, Agent, or Firm*—Wenderoth, Lind & Ponack, L.L.P.

(57) ABSTRACT

An electrode pattern of an electrostatic chuck includes linear portions in a radial direction and a plurality of concentric C-shaped portions branching out from the linear portions. The linear portions are disposed opposite to each other in a diametrical direction and are such that they lie on a line that is almost straight. The C-shaped portions are engaged alternately like teeth of a comb.

7 Claims, 5 Drawing Sheets

US 7,283,346 B2

ELECTROSTATIC CHUCK AND ITS MANUFACTURING METHOD

TECHNICAL FIELD

The present invention relates to a bipolar electrostatic chuck, which is used in the manufacture of various semiconductor thin film devices like amorphous silicon solar cell, thin film transistors used in liquid crystal displays etc.

BACKGROUND ART

Electrostatic chucks have an electrode, and the electrostatic chucks are used to hold a wafer to a wafer stage by Coulomb's force acting between the electrode and the wafer. As against mechanical chucks, in the electrostatic chucks, almost the whole of the bottom surface of the wafer closely adheres onto the wafer stage so that the wafer can be cooled effectively. Therefore, the electrostatic chuck is used widely. There are two types of electrostatic chuck: monopole electrostatic chuck and bipolar electrostatic chuck. In the case of the monopole electrostatic chucks, adsorption does not occur if there is no plasma around. Therefore, the monopole electrostatic chuck can be used only in plasma processing units. On the other hand, in the case of the bipolar electrostatic chucks, plasma is not required for the adsorption.

FIG. 5 is a top view illustrating a pattern of electrodes in a conventional electrostatic chuck. An electrostatic chuck 500 includes a pair of electrodes 501a and 501b (electrode pattern) in the form of concentric arcs. These electrodes are embedded inside an insulating body on a surface. One electrode 501a is a positive electrode and the other electrode 501b is a negative electrode. These electrodes 501a and 501b make up the whole of the wafer adsorption area of the electrostatic chuck 500. The positive electrode 501a includes a linear portion 502a formed in radial direction and a plurality of concentric arc portions 503a branched out from the linear portion 502a. The linear portions 502a and the arc portions 503a are disposed in such a way that they form a circle together. The electrodes 501a facing each other in two halves of the circle are connected to each other in the outermost peripheral circle.

The negative electrode 501b is structured similarly. However, the electrodes 502b facing each other in two halves of a circle are connected to each other at the center of the circle. The positive electrode 501a and the negative electrode 501b are formed by the arc portions 503a and 503b, which are disposed alternately and engaged like teeth of a comb. This pattern of electrodes 501a and 501b can be formed with precision by photo fabrication. When a voltage is applied on both of the positive and negative electrodes 501a and 501b of the electrostatic chuck 500, a stable and uniform adsorptivity is generated over almost the whole of the wafer adsorption area due to the electrode patterns 501 and 502b.

Sometimes, the wafer stage employing the electrostatic chuck 500 is provided with lifting pins to separate the wafer. The lifting pins are provided such that they protrude out from lifting pinholes that are spread evenly on the wafer stage. It is desirable to have 3 lifting pins (not shown in the diagram) 120 degrees apart to ensure that the wafer is supported firmly by the lifting pins.

However, in the electrostatic chuck 500, the linear portions 502a and 502b in the radial direction of the positive and negative electrodes 501a and 501b, are 90 degrees apart. Therefore, one or two lifting pinholes have to be provided on these linear portions 502a and 502b. However, it is desirable that electrode pattern must be designed to avoid this. In one of the structures, the electrode patterns 501a and 501b that are in the form of branches are disposed opposite to each other and connected to each other at either the outermost peripheral circle or at the center. This structure results in complicating the electrode patterns 501a and 501b.

DISCLOSURE OF THE INVENTION

It is an object of the present invention to solve at least the problems in the conventional technology.

A bipolar electrostatic chuck according to one aspect of the present invention includes a positive electrode and a negative electrode that are almost circular in shape. The positive electrode and the negative electrode include linear portions extending in a radial direction and a plurality of concentric C-shaped portions branching from both sides of the linear portions, and the linear portions are opposite to each other in a diametrical direction and are disposed such that they lie on a line that is almost straight, and the C-shaped portions are disposed such that they are engaged alternately like teeth of a comb to form an electrode pattern.

A bipolar electrostatic chuck according to another aspect of the present invention includes a positive electrode and a negative electrode that are almost circular in shape. The positive electrode and the negative electrodes include a plurality of concentric C-shaped portions and a plurality of short linear portions connected to the adjacent C-shaped portions in the radial direction, and the C-shaped portions are disposed such that they are engaged alternately like teeth of a comb and each of the short linear portions is disposed by shifting in a circumferential direction in between two radially adjacent C-shaped portions of the same polarity.

An electrostatic chuck according to still another aspect of the present invention includes a comma-shaped positive electrode and a comma-shaped negative electrode that are point symmetrical; and a reverse S-shaped positive electrode and a reverse S-shaped negative electrode that are disposed between the comma-shaped positive electrode and the comma-shaped negative electrode. The reverse S-shaped positive electrode is adjacent to the comma-shaped negative electrode and the reverse S-shaped negative electrode is adjacent to the comma-shaped positive electrode.

The other objects, features and advantages of the present invention are specifically set forth in or will become apparent from the following detailed descriptions of the invention when read in conjunction with the accompanying drawings.

BEST MODE FOR CARRYING OUT THE INVENTION

Exemplary embodiments of the present invention will be explained hereinafter in detail with reference to the accompanying drawings. This invention is not limited by these embodiments. Moreover, technical changes in design of components in the following embodiments may be carried out by a person having ordinary skill in the art.

Figure 1:
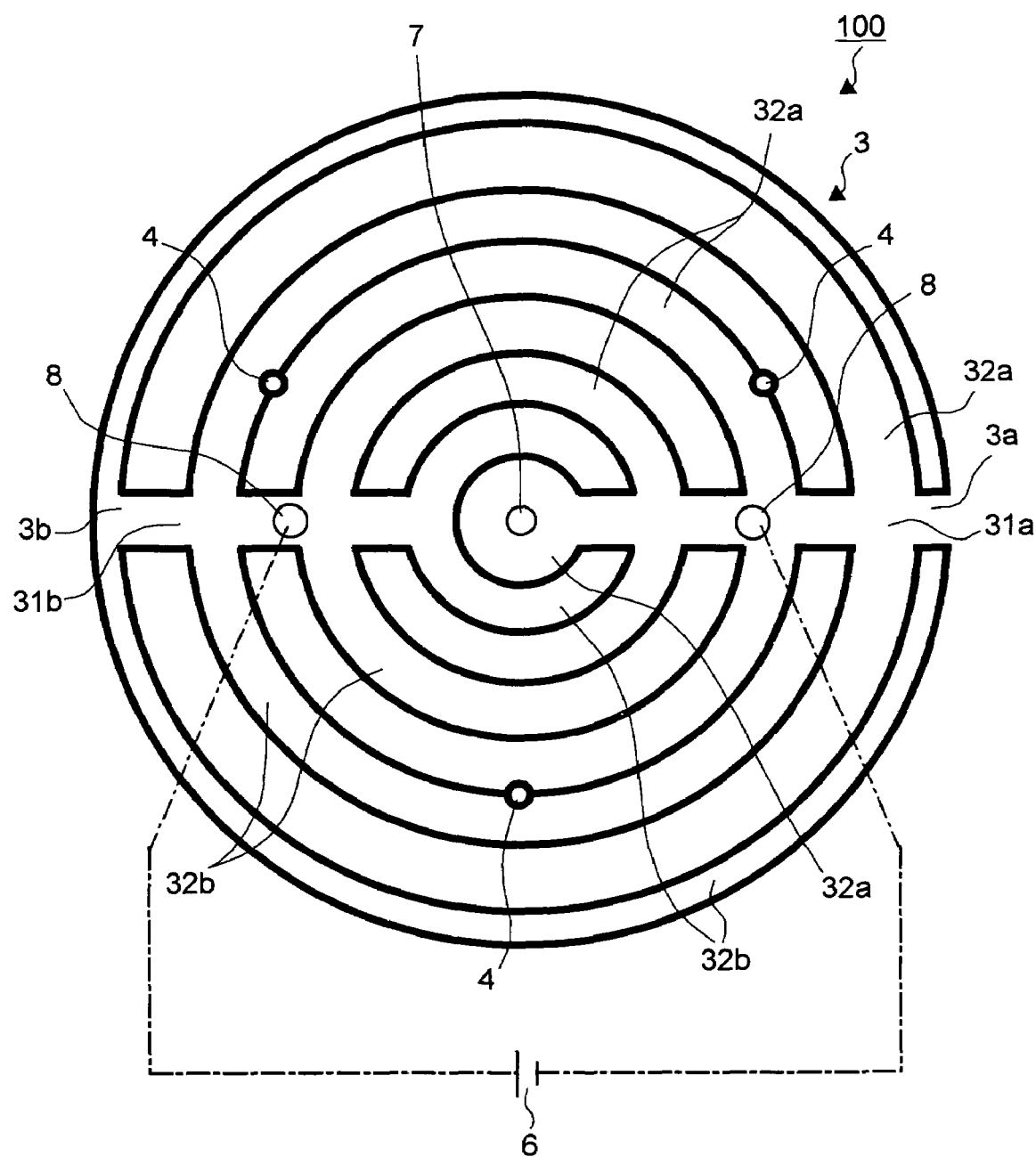
FIG. 1 is a top view of an electrode pattern of an electrostatic chuck in a first embodiment of the present invention.
Figure 2:
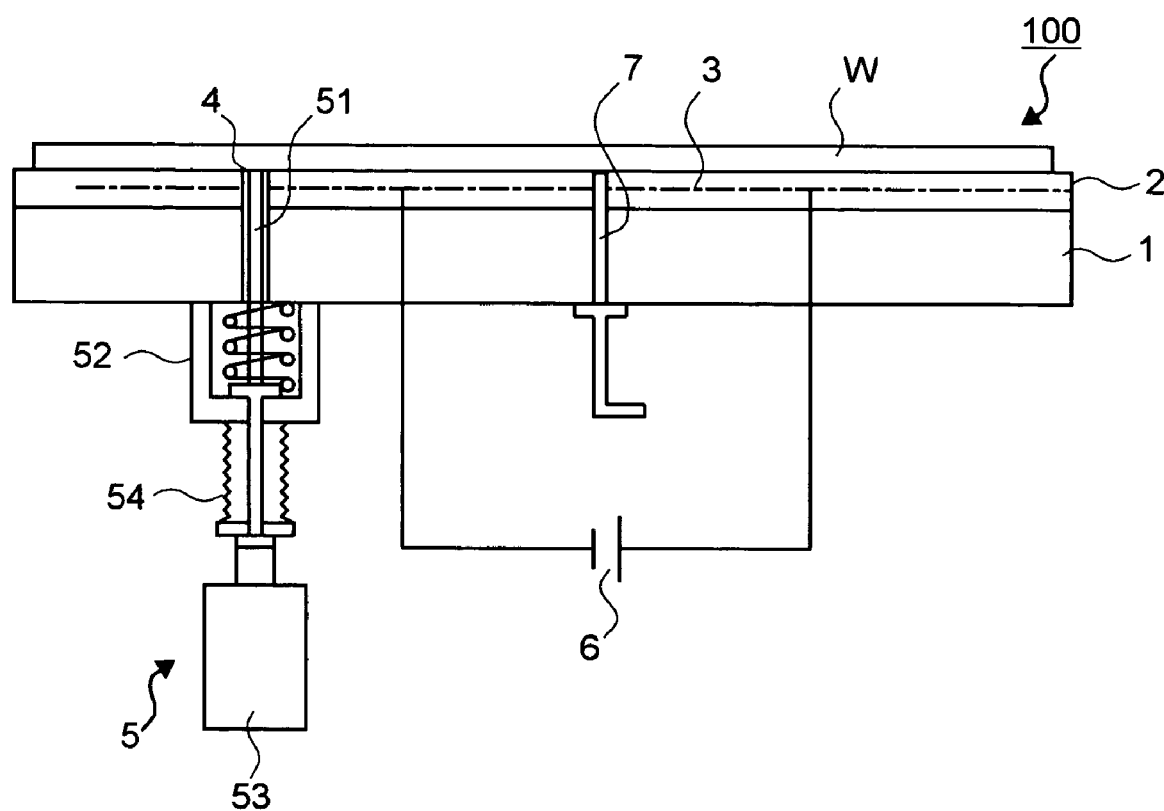
FIG. 2 is a cross sectional view of the electrostatic chuck in FIG. 1.

FIG. 1 is a top view of an electrode pattern of an electrostatic chuck in the first embodiment of the present invention. FIG. 2 is a cross sectional view of the electrostatic chuck in FIG. 1. An electrostatic chuck 100 includes a wafer stage 1, an insulating body 2 that is provided on the wafer stage 1, and a bipolar electrode 3 (electrode pattern 3) embedded in the insulating body 2. A positive electrode 3a and a negative electrode 3b have linear portions 31a and 31b in radial direction. A plurality of C-shaped portions 32a and 32b are branched out from the linear portion 31a and 31b. The linear portions 31a and 31b are diametrically opposite to each other and almost in a straight line. Moreover, the C-shaped portions 32a and 32b are concentric and are engaged alternately like teeth of a comb.

Furthermore, an edge of the linear portion 31a of the positive electrode is circular in shape and is in the C-shaped portion of the negative electrode having a minimum diameter. The electrode pattern 3 can be formed with precision by a photolithography process. It is desirable to have about 3 to 4 C-shaped portions 32a and 32b, which are extended like branches, to simplify the pattern and to increase electrode area. A ceramic like alumina is used for the insulating body 2.

Lifting pinholes 4 are disposed at a portion where the electrode pattern 3 is not formed, such as at the center of the hole. The holes are disposed by avoiding the linear areas 31a and 31b of positive and the negative electrodes respectively. Therefore, the linear portions 31a and 31b are unaffected and the structure is simple. Moreover, the electrode pattern 3 is embedded in the insulating body 2 that is provided on the wafer stage 1. The wafer stage 1 includes a cooling water tube (not shown in the figure), a lifting pin mechanism 5 etc. inside the stage. A direct current power supply 6 is connected to the positive and negative electrodes 3a and 3b.

The lifting pin mechanism 5 includes a pin shaft 51 that is made of alumina and that passes through the lifting pinhole 4, a flange 52 that accommodates the pin shaft 51 and through which helium gas is introduced, and an air cylinder 53 that moves the pin shaft 51 up and down. Bellows 54 isolate the inside of the flange 52 from the outside. Moreover, an outlet 7 for helium gas is provided at a center of the wafer stage 1.

A node 8 that is connected to the direct current power supply 6 is provided almost at the center of the linear portions 31a and 31b of the electrode pattern 3. The positive and negative electrodes 3a and 3b have uniform width and almost equal area and thickness. The electrode pattern is symmetrical in shape and the positive electrode and the negative electrode are very similar to each other. Therefore the electrode pattern 3 has almost same resistance. If the node 8 is to be disposed according to the positive and the negative electrodes, it can be disposed in any position. Thus, the structure can be designed with utmost liberty not only when there is only one node 8 but particularly when a plurality of nodes 8 is provided.

When a direct current 6 is applied to the positive and the negative electrodes 3a and 3b, Coulomb's force acts between a wafer W and the electrode 3 and the wafer W is adsorbed into the electrode 3. At the time of adsorption, the electrode pattern 3 is formed as explained above. Therefore, the Coulomb's force corresponding to the wafer W acts over almost the whole of the wafer adsorption area. Moreover, it is desirable to have equal area of the positive and the negative electrode patterns in general. However, a simple form of pattern is used in the electrode pattern 3 and complications in the form caused due to the lifting pin mechanism are minimized. Therefore, it is easy to make the area of the positive and the negative electrodes equal.

In this electrostatic chuck 100, due to the simple electrode pattern 3, it is possible to achieve stable and uniform adsorptivity over almost the whole of the wafer adsorption area. As a result, temperature unevenness of the wafer W is eliminated, thereby making uniform processing possible.

There is a case in which a radio frequency (RF) is superimposed on the electrode pattern 3 to carry out sputter etching. In conventional electrostatic chucks, the electrode pattern in which electrodes facing opposite to each other is partly connected. Therefore, the convergence of current in the positive and the negative electrodes becomes difficult. On the other hand, in the electrostatic chuck 100 of the present invention, there is hardly any portion where the convergence of current becomes difficult. Moreover, generation of heat by the electrode 3 is suppressed due to the use of alternately engaged comb teeth form in the electrode pattern 3.

Moreover, when the electrostatic chuck 100 is used in a plasma processing unit, the wafer W is negatively charged. Although the adsorptivity acts between the negative charge on the wafer W and a positive charge on the positive electrode 3a, a repulsive force acts between the negative charge on the wafer W and a negative charge on negative electrode 3b. However, the electrode pattern 3 of the positive electrode and the negative electrode is made to have equal area and the electrodes are distributed uniformly by arranging in the alternately engaged comb teeth pattern. Therefore, even when the electrostatic chuck 100 is used in the plasma processing unit, it is possible to improve the overall close contact.

Figure 3:
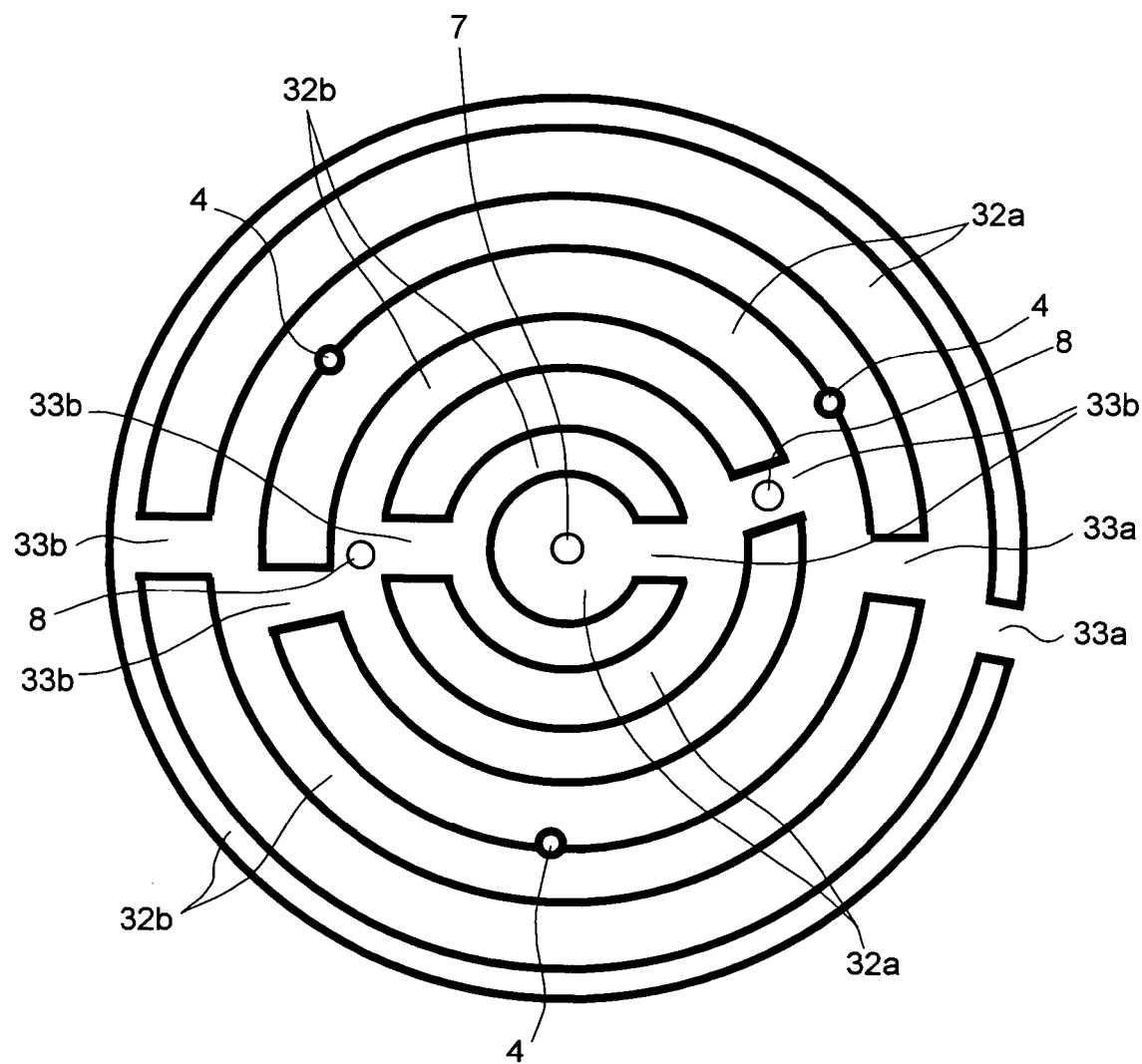
FIG. 3 is a top view illustrating an example of variation of the electrode pattern in FIG. 1.

FIG. 3 is a top view illustrating an example of variation of the electrode pattern in FIG. 1. In this electrode pattern, linear portions (short linear portions) 33a and 33b between the adjacent C-shaped portions 32a and 32b are shifted in a circumferential direction. The new structure as a result of this shifting of the short linear portions 33a and 33b, prohibits concentration of one of the positive electrodes in one position, thereby distributing the positive electrodes uniformly. This structure enables to achieve stable and uniform adsorptivity over the whole of the wafer adsorption area and is particularly effective when the electrostatic chuck 100 is used in the plasma processing unit.

Figure 4:
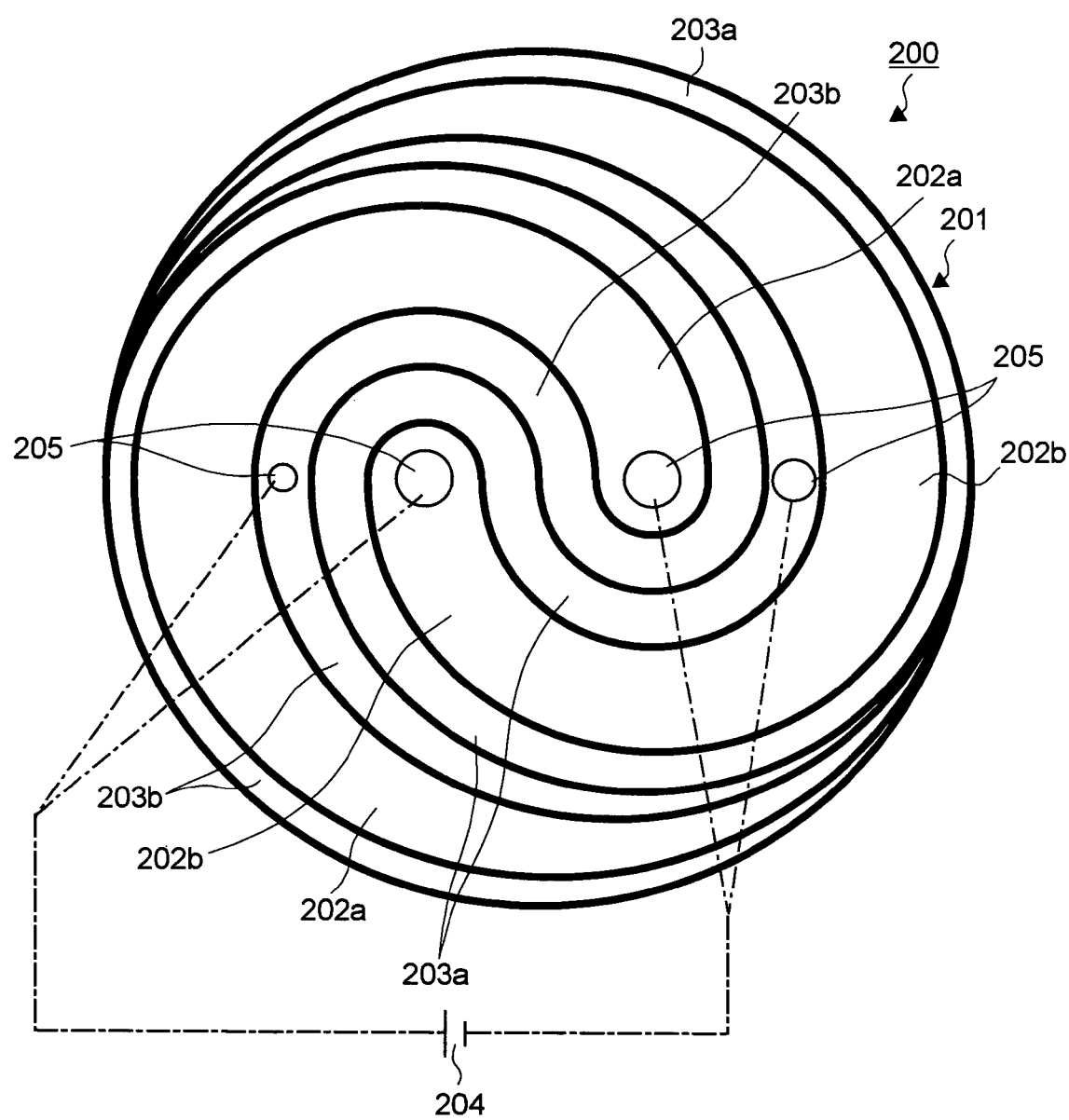
FIG. 4 is a top view of an electrode pattern of an electrostatic chuck in a second embodiment of the present invention.
Figure 5:
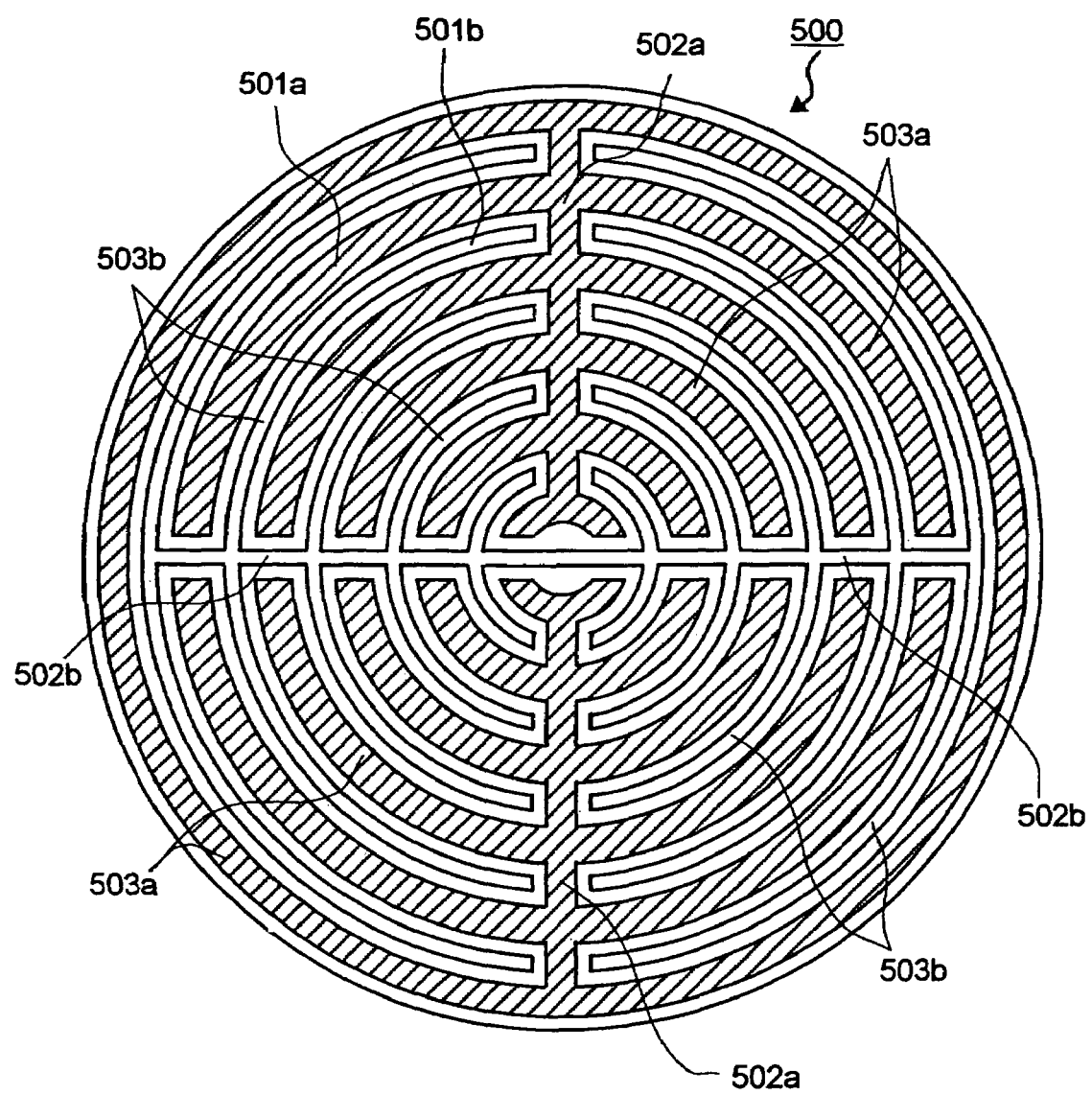
FIG. 5 is a top view of an electrode pattern of a conventional electrostatic chuck.

FIG. 4 is a top view of an electrode pattern of an electrostatic chuck in the second embodiment of the present invention, which is explained next. An electrode 201 (an electrode pattern 201) of an electrostatic chuck 200 includes comma-shaped positive and negative electrodes, 202a and 202b. The pattern is formed such that the comma-shaped electrodes 202a and 202b are point symmetrical from the center of the electrode pattern 201. Ends of the comma-shaped electrodes 202a and 202b narrow toward the circumference of the circle.

Moreover, the S-shaped positive and negative electrodes 203a and 203b are disposed between the comma-shaped electrodes 202a and 202b. Ends of the S-shaped electrodes 203a and 203b also narrow toward the circumference of the circle. Thus, the reverse S-shaped negative electrode 203b is adjacent to the comma-shaped positive electrode 202a and the reverse S-shaped positive electrode 203a is adjacent to the comma-shaped negative electrode 202b. Contact points 205 connected to a direct current power supply 204 are provided on a head portion of comma-shaped electrodes 202a and 202b and at a position approximately halfway on the reverse S-shaped electrodes 203a and 203b.

According to the electrode pattern 201, in almost all radial directions, there are 3 electrodes having the same polarity and moreover, the area of comma-shaped electrodes 202a and 202b can be increased. Moreover, the positive and negative electrodes are symmetrical and their area is exactly the same. Therefore, stable and uniform adsorption can be achieved over almost the whole of the wafer adsorption area. Further, even when used in a plasma processing unit, there are 3 positive electrodes in almost all radial directions thereby enabling to achieve stable adsorption. When a radio frequency (RF) is superimposed on the electrode pattern 201, there is hardly any portion in which current is converged. Therefore, generation of heat by the electrode pattern 201 is suppressed considerably.

Thus, an electrostatic chuck according to the present invention has a simple structure and provides uniform and stable adsorption.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

INDUSTRIAL APPLICABILITY

Thus, an electrostatic chuck in the present invention is very useful for manufacturing of various semiconductor thin film devices and suitable for achieving stable and uniform adsorptivity over almost whole of the wafer adsorption area.

The invention claimed is:

1. A bipolar electrostatic chuck comprising:
 a positive electrode and a negative electrode that are almost circular in shape,
 the positive electrode and the negative electrode including linear portions extending in a radial direction and a plurality of concentric C-shaped portions branching from the linear portions; and
 wafer lifting pins in a region that is between the adjacent C-shaped portions and that excludes the linear portions, wherein
 the linear portions are substantially collinear and diametrically opposite each other, and have the C-shaped portions enmeshed with each other; and
 the linear portions of the positive electrode and the negative electrode are each provided with at least one node therealong that is configured to supply power to said chuck.

2. A bipolar electrostatic chuck comprising:
 a positive electrode and a negative electrode that are almost circular in shape, wherein:
 the positive electrode and the negative electrode include a plurality of concentric C-shaped portions and a plurality of short linear portions radially connecting the C-shaped portions;
 the C-shaped portions of the positive electrode and the negative electrode are enmeshed with each other;
 the short linear portions connect C-shaped portions of the plurality of concentric C-shaped portions of the same polarity and at least one of said short linear portions is circumferentially offset with respect to others of said short linear portions; and
 at least one of the plurality of short linear portions of the positive electrode and at least one of the plurality of short linear portions of the negative electrode are provided with a node configured to supply power to said chuck.

3. The electrostatic chuck according to claim 2, further comprising wafer lifting pins in a region that is between the adjacent C-shaped portions and that excludes the linear portions.

4. An electrostatic chuck comprising:
 a comma-shaped positive electrode and a comma-shaped negative electrode that are point symmetrical; and
 a reverse S-shaped positive electrode and a reverse S-shaped negative electrode that are disposed between the comma-shaped positive electrode and the comma-shaped negative electrode, wherein
 the reverse S-shaped positive electrode is adjacent to the comma-shaped negative electrode and the reverse S-shaped negative electrode is adjacent to the comma-shaped positive electrode.

5. The electrostatic chuck according to claim 4, further comprising:
 a node, to supply electric power, on a head portion of each of the comma-shaped positive electrode and the comma-shaped negative electrode; and
 a node, to supply electric power, at a position approximately halfway along the reverse S-shaped positive electrode and the reverse S-shaped negative electrode.

6. The electrostatic chuck of claim 1, wherein the nodes configured to supply power to said chuck are approximately midway along the linear portions of each of the positive electrode and the negative electrode.

7. The electrostatic chuck of claim 2, wherein the nodes configured to supply power to said chuck are provided on one of the plurality of short linear portions of each of the electrodes which is both radially interior to at least a second one of the plurality of short linear portions of the same polarity, and radially exterior to at least a third one of the plurality of short linear portions of the same polarity.

* * * * *